US006955965B1

(12) United States Patent
Halliyal et al.

(10) Patent No.: US 6,955,965 B1
(45) Date of Patent: *Oct. 18, 2005

(54) PROCESS FOR FABRICATION OF NITRIDE LAYER WITH REDUCED HYDROGEN CONTENT IN ONO STRUCTURE IN SEMICONDUCTOR DEVICE

(75) Inventors: Arvind Halliyal, Cupertino, CA (US); Tazrien Kamal, San Jose, CA (US); Hidehiko Shiraiwa, San Jose, CA (US); Jean Y. Yang, Sunnyvale, CA (US)

(73) Assignee: FASL, LLC, Sunnyvale, CA (US)

( * ) Notice: Subject to any disclaimer, the term of this patent is extended or adjusted under 35 U.S.C. 154(b) by 92 days.

This patent is subject to a terminal disclaimer.

(21) Appl. No.: 10/731,659

(22) Filed: Dec. 9, 2003

(51) Int. Cl.$^7$ .............................. H01L 21/336
(52) U.S. Cl. ...................... 438/257; 438/786
(58) Field of Search ........................ 438/257

(56) References Cited

U.S. PATENT DOCUMENTS

| | | | |
|---|---|---|---|
| 5,284,549 A | 2/1994 | Barnes et al. ............... 156/662 |
| 5,648,113 A | 7/1997 | Barbee et al. ................. 428/8 |
| 5,707,901 A | 1/1998 | Cho et al. .................... 438/595 |
| 5,840,600 A * | 11/1998 | Yamazaki et al. .......... 438/151 |
| 5,872,387 A | 2/1999 | Lyding et al. ............... 257/607 |
| 5,970,384 A | 10/1999 | Yamazaki et al. .......... 438/795 |
| 6,022,799 A | 2/2000 | Foote et al. ................. 438/637 |
| 6,037,003 A | 3/2000 | Gordon et al. ......... 427/255.34 |
| 6,180,190 B1 | 1/2001 | Gordon ....................... 427/565 |
| 6,190,966 B1 * | 2/2001 | Ngo et al. ................... 438/257 |
| 6,194,784 B1 | 2/2001 | Parat et al. ................. 257/774 |
| 6,306,777 B1 | 10/2001 | Ogle, Jr. et al. ............ 438/763 |
| 6,319,775 B1 | 11/2001 | Halliyal et al. ............. 438/261 |
| 6,319,809 B1 * | 11/2001 | Chang et al. ............... 438/597 |
| 6,468,599 B1 | 10/2002 | Terada ......................... 427/558 |
| 6,479,379 B2 | 11/2002 | Reinberg .................... 438/635 |
| 6,740,605 B1 * | 5/2004 | Shiraiwa et al. ............ 438/795 |
| 6,750,157 B1 * | 6/2004 | Fastow et al. .............. 438/786 |
| 6,767,796 B2 * | 7/2004 | Ito et al. ...................... 438/299 |
| 6,797,650 B1 * | 9/2004 | Wang et al. ................. 438/786 |
| 6,803,265 B1 * | 10/2004 | Ngo et al. ................... 438/188 |
| 2002/0068229 A1 | 6/2002 | Westerman et al. ............ 430/5 |

OTHER PUBLICATIONS

U.S. Appl. No. 10/731,494, filed Dec, 9, 2003, entitled "Improved Process for Fabrication of Spacer Layer with Reduced Hydrogen Content in Semiconductor Device."

* cited by examiner

Primary Examiner—Thao P. Le
(74) Attorney, Agent, or Firm—Renner, Otto, Boisselle & Sklar, LLP

(57) ABSTRACT

Process for fabricating a charge trapping dielectric flash memory device including steps of providing a semiconductor substrate; forming on the semiconductor substrate a bottom oxide layer; depositing on the bottom oxide layer a nitride layer, the deposited nitride layer having a first hydrogen content; and applying a treatment to reduce the first hydrogen content to a second hydrogen content.

20 Claims, 4 Drawing Sheets

PROCESS FOR FABRICATION OF NITRIDE LAYER WITH REDUCED HYDROGEN CONTENT IN ONO STRUCTURE IN SEMICONDUCTOR DEVICE

TECHNICAL FIELD

The present invention relates to semiconductor devices and the fabrication thereof and, more particularly, to a semiconductor device with reduced hydrogen content in the nitride layer of an ONO structure and a method of formation of the nitride layer with reduced hydrogen content.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important charge storage material for EEPROM devices is a charge trapping dielectric, for example silicon nitride in an oxide-nitride-oxide (ONO) structure. One EEPROM device that utilizes a charge trapping dielectric charge storage layer is a silicon-oxide-nitride-oxide-silicon (SONOS) type flash memory cell. In other such devices, like SONOS, the charge storage is in a charge trapping dielectric layer, but the materials of the various layers may vary from those used in SONOS devices. That is, the silicon, oxide or nitride may be replaced with another material. For example, silicon may be replaced by germanium or silicon-germanium, oxide and/or nitride may be replaced by, e.g., a high-K dielectric material. Such devices, as well as the SONOS device, are generally included within the designation "charge trapping dielectric flash memory" device, as used herein.

In charge trapping dielectric flash memory devices, during programming, electrical charge is transferred from the substrate to the charge trapping dielectric charge storage layer, e.g., the nitride (N) layer in an ONO structure. Voltages are applied to the gate and drain creating vertical and lateral electric fields, which accelerate the electrons along the length of the channel. As the electrons move along the channel, some of them gain sufficient energy to jump over the potential barrier of the bottom oxide layer and become trapped in the charge trapping dielectric layer. This jump is known as hot carrier injection (HCI), the hot carriers being electrons. Electrons are trapped near the drain region because the electric fields are the strongest near the drain. Reversing the potentials applied to the source and drain will cause electrons to travel along the channel in the opposite direction and be injected into the charge trapping dielectric layer near the source region. Because the charge trapping dielectric material is not electrically conductive, the charge introduced into the charge trapping dielectric layer tends to remain localized. Accordingly, depending upon the application of voltage potentials, electrical charge can be stored in discrete regions within a single continuous charge trapping dielectric charge storage layer.

Non-volatile memory designers have taken advantage of the localized nature of electron storage within a charge trapping dielectric layer and have designed memory circuits that utilize two or more regions of stored charge within the layer. This type of non-volatile memory device is known as a dual-bit or multi-bit EEPROM, or as a charge trapping dielectric flash memory device. Such a device is available under the trademark MIRRORBIT™ from Advanced Micro Devices, Inc., Sunnyvale, Calif. The MIRRORBIT™ device is capable of storing twice as much information as a conventional EEPROM in a memory array of equal size. A left bit and a right bit are stored in physically different areas of the charge trapping dielectric layer, near the left and right regions of each memory cell. The above-described programming methods are used to enable the two bits to be programmed and read independently. The two bits of the memory cell can be individually erased by applying suitable erase voltages to the gate and to either the source or drain regions.

While the recent advances in charge trapping dielectric flash memory technology have enabled memory designers to double the memory capacity of charge trapping dielectric flash memory arrays using dual-bit data storage, numerous challenges remain in the fabrication of material layers within these devices.

In a charge trapping dielectric flash memory cell, the control gate electrode is separated from the charge trapping dielectric charge storage layer by a top dielectric layer (usually an oxide), and the charge storage layer is separated from the semiconductor substrate (channel region) by a bottom dielectric layer (usually an oxide), forming the oxide-charge trapping dielectric-oxide stack, e.g., the ONO structure. The control gate electrode is isolated from laterally surrounding structures by a gate stack spacer, which conventionally comprises a thin layer (e.g., about 100–150 angstroms) of silicon dioxide and a larger structure of silicon nitride.

The conventional charge trapping dielectric charge storage layer is, e.g., silicon nitride, and is deposited by PECVD or LPCVD. However, PECVD imparts a significant hydrogen content to the silicon nitride or other dielectric material deposited thereby using conventional materials. For example, the conventionally employed PECVD method can impart substantially greater than about two atomic percent, e.g., up to as much as about 30 atomic percent, hydrogen into the silicon nitride of the charge storage layer. Previously, the hydrogen content in the nitride layer of ONO structures either has not presented a significant problem to proper functioning of semiconductor devices having an ONO structure, such as charge trapping dielectric flash EEPROM memory devices, or has been addressed by other processes which are difficult to extend to smaller dimensions. As noted above, as dimensions continue to be reduced, more variables must be considered in the design and fabrication of semiconductor devices.

Hydrogen content is a variable which may affect performance of semiconductor devices generally, and as exemplified herein, in charge trapping dielectric flash EEPROM memory devices, particularly in view of the continually-sought reduced dimensions of modern semiconductor devices. The present inventors have discovered that hydrogen contained in the nitride layer of an ONO structure can migrate into adjacent dielectric layers such as the adjacent oxide layers, the bottom or tunnel oxide layer, and/or the top oxide layer in a charge trapping dielectric charge storage device. Hydrogen in these oxide layers can cause problems such as degradation of device properties. These problems may include adverse effects on the subthreshold slope or transconductance GM after program/erase as a result of the migration. As device dimensions have steadily decreased, the effect of such hydrogen becomes more pronounced, as discovered by the present inventors.

Accordingly, advances in fabrication technology of structures such as the charge trapping dielectric charge storage layer structure mentioned above are needed to eliminate or reduce problems resulting from hydrogen in the charge trapping dielectric charge storage layer used in charge trapping dielectric flash memory devices. While the present invention is described particularly with respect to a particular embodiment, i.e., the charge trapping dielectric flash memory device, the invention is broadly applicable to any semiconductor device which includes an ONO structure and is susceptible to adverse effects resulting from the presence of hydrogen in dielectric layers.

DISCLOSURE OF THE INVENTION

The present invention, in one embodiment, relates to a process for fabricating a semiconductor device having a ONO structure, including providing a semiconductor substrate; forming on the semiconductor substrate an oxide layer; depositing on the bottom oxide layer a nitride layer, the deposited nitride layer having a first hydrogen content; and applying a treatment to reduce the first hydrogen content to a second hydrogen content.

In another embodiment, the present invention relates to a process for fabricating a charge trapping dielectric flash memory device including providing a semiconductor substrate; forming on the semiconductor substrate a bottom oxide layer; depositing on the bottom oxide layer a charge trapping dielectric charge storage layer, the deposited charge trapping dielectric charge storage layer having a first hydrogen content; applying a treatment to reduce the first hydrogen content to a second hydrogen content.

In another embodiment, the present invention relates to charge trapping dielectric flash memory device including a semiconductor substrate having formed thereon a gate stack comprising a charge trapping dielectric charge storage layer; and wherein the charge trapping dielectric charge storage layer comprises a hydrogen content less than about two atomic percent.

Thus, the present invention addresses the problem of hydrogen in nitride layers of ONO structures in semiconductor devices, such as charge trapping dielectric charge storage layers in charge trapping dielectric flash memory devices, in which the hydrogen may cause problems in operation of the semiconductor device resulting from its presence in the dielectric materials of the ONO structure.

Figure 1:
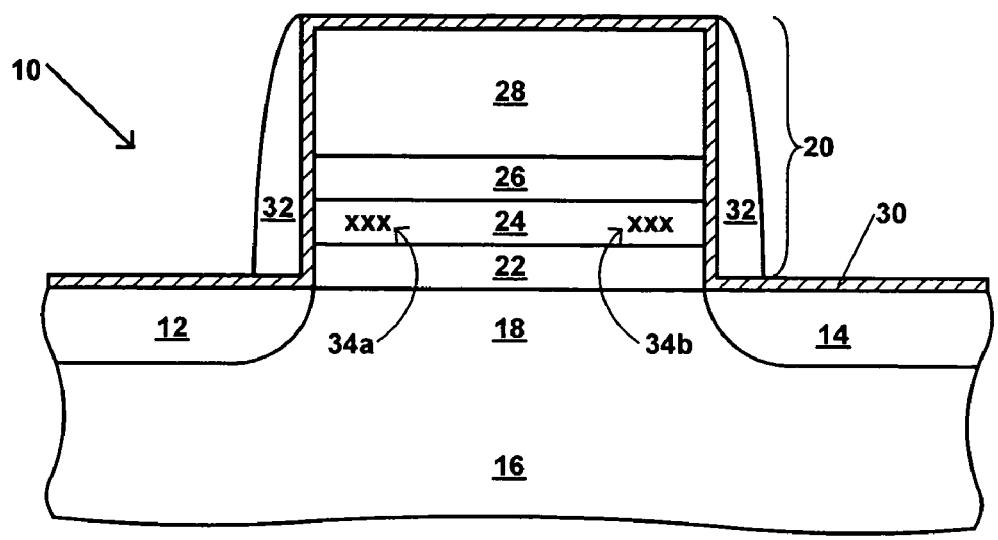
FIG. 1 is a schematic cross-sectional view of a portion of a semiconductor substrate containing a charge trapping dielectric flash memory device including a charge trapping dielectric charge storage layer fabricated in accordance with an embodiment of the invention.

It should be appreciated that for simplicity and clarity of illustration, elements shown in the Figures have not necessarily been drawn to scale. For example, the dimensions of some of the elements may be exaggerated relative to each other for clarity. Further, where considered appropriate, reference numerals have been repeated among the Figures to indicate corresponding elements.

It should be appreciated that the process steps and structures described below do not form a complete process flow for manufacturing a semiconductor device such as a charge trapping dielectric flash memory device or other device. The present invention can be practiced in conjunction with fabrication techniques currently used in the art, and only so much of the commonly practiced process steps are included as are necessary for an understanding of the present invention.

DETAILED DESCRIPTION OF THE INVENTION

It should be appreciated that while the present invention will be described in terms of a charge trapping dielectric flash memory device, the present invention is not limited to such device, and is applicable to a broad range of semiconductor devices and their fabrication processes. Generally speaking the semiconductor devices will include at least one active component therein, for example a diode, transistor, thyristor or the like. Illustrative examples include MOS-based devices such as MOSFET devices, including CMOS and NMOS technology, light-emitting diodes, laser diodes, and the like. In this regard, the MOS-based technology discussed herein is intended to encompass the use of gate conductors other than metals as is commonly practiced, and thus reference to MOS-based devices encompasses other insulated gate technologies (e.g. IGFETS). While aspects of the present invention will now be described in more detail with reference to a charge trapping dielectric flash memory device, it will be understood that the invention is applicable to the above-mentioned and other semiconductor devices which are susceptible to problems resulting from the hydrogen content of elements of which the device is formed, where the elements, such as dielectric layers, are amenable to treatments such as disclosed herein for reduction of the hydrogen content.

Turning now to FIG. 1, there is schematically shown in cross-section a transistor 10 suitable for use in a charge trapping dielectric flash memory device, such as the MIRRORBIT™. The transistor 10 includes source/drain regions 12 and 14 located in a semiconductor substrate 16 and separated by a channel region 18. A gate stack 20 is formed over the channel region 18, and may extend over portions of the source region 12 and the drain region 14. The gate stack 20 may also be referred to as a stacked-gate or stack gate structure. The gate stack 20 includes a bottom oxide layer 22, a charge trapping dielectric charge storage layer 24 and a top oxide layer 26, as shown in FIG. 1. The gate stack 20 further includes a gate electrode 28 overlying the top oxide layer 26. The bottom oxide layer 22, the charge storage layer 24 and the top oxide layer 26 are sometimes referred to herein and in the art as an ONO structure. In conventional ONO structures, the "O" oxide layers are silicon dioxide, and the "N" charge storage layer is silicon nitride. In accordance with some embodiments of the present invention, the ONO structure may include, in either or both "O" layers, materials other than silicon dioxide, and "N" charge trapping dielectric charge storage materials other than silicon nitride, but the resulting structure will still be referred to herein as an ONO structure. For example, any one or more of the O layers or the N layer may comprise a high-K dielectric material, as described in more detail below. As schematically shown in FIG. 1, charges 34a and 34b may be stored in the charge storage layer 24, which acts as a charge or electron storage layer in the charge trapping dielectric flash memory device.

Referring still to FIG. 1, as shown therein, in the embodiment shown, the gate stack 20 is covered by a thin oxide layer 30. The thin oxide layer 30 enhances isolation of the gate stack 20 and other elements of the device 10. The thin oxide layer 30 may have a thickness in the range from about 20 angstroms to about 300 angstroms, for example, and in one embodiment, about 100 angstroms. The thin oxide layer 30 may be formed or deposited by any conventionally known method for forming or depositing such a layer. The thin oxide layer 30 is generally used, but is not a required element. As shown in FIG. 1, gate stack spacers 32 are located on both sides of the gate stack 20. The gate stack spacers 32 alternatively may be referred to as isolation spacers or sidewall spacers.

In accordance with the present invention, the charge trapping dielectric charge storage layer 24 comprises a reduced quantity or concentration of hydrogen, in which "reduced" refers to the hydrogen content of the layer relative to the hydrogen content of a conventional, as-deposited layer of the same dielectric material. In accordance with the present invention, the charge trapping dielectric charge storage layer is first deposited by conventional methods and is thereafter treated to reduce the hydrogen content of the charge storage layer from a first, as-formed, hydrogen content to a second, lower, hydrogen content, by applying one or more of the treatments described in more detail below. Thus, as used herein, "reduced hydrogen content" refers to the hydrogen content of a structure such as the nitride layer of an ONO structure, for example following the treatment disclosed herein, relative to the hydrogen content of a conventional, as-deposited structure of the same material.

Operation of the charge trapping dielectric flash memory device 10 shown in FIG. 1, is substantially the same as described in the background of the invention, except that reducing the hydrogen content in the charge trapping dielectric charge storage layer 24 facilitates continued smooth and problem free processing and operation of the device in use. In the operation of the exemplary charge trapping dielectric flash memory 10, voltages are applied to the gate electrode 28 and as appropriate to the source/drain regions 12 and 14. The applied voltages cause electrical charge, e.g., one of charges 34a or 34b, to propagate from the channel region 18 into the charge storage layer 24. The charges 34a, 34b are localized in regions of the charge storage layer 24 in proximity to either the source/drain region 12, or the source/drain region 14, as shown in FIG. 1.

Those skilled in the art will recognize that for proper functioning of a charge trapping dielectric flash memory device, the electrical charges 34a, 34b should remain localized and isolated in the regions of the charge storage layer 24 to which it is initially introduced. Furthermore, it has become apparent that hydrogen contamination of the bottom oxide layer 22 and/or the top oxide layer 26 can cause non-ideal capacitance voltage characteristics and channel conductance. The inventors have further discovered that hydrogen in elements such as the charge trapping dielectric charge storage layer 24 can migrate into adjacent structural elements, such as the bottom oxide layer 22 and/or the top oxide layer 26, during subsequent processing and/or during use of the device, and thereby result in such problems. In other types of semiconductor devices, any such excess hydrogen in a dielectric material layer, and in particular in the nitride layer of an ONO structure, may migrate into adjacent structural elements and thereby cause similar problems due to its presence. Thus, hydrogen may present a problem in the function of the layer in which it is originally present, or in layers into which it may migrate during subsequent processing or during end use.

In accordance with the invention, the charge trapping dielectric charge storage layer 24 is deposited and is subsequently treated by methods which result in the reduction of the hydrogen content, relative to such structures formed by conventional methods and not so treated. The improved device performance obtained by the present invention can be better understood following a description of a fabrication process carried out in accordance with the invention.

Figure 8:
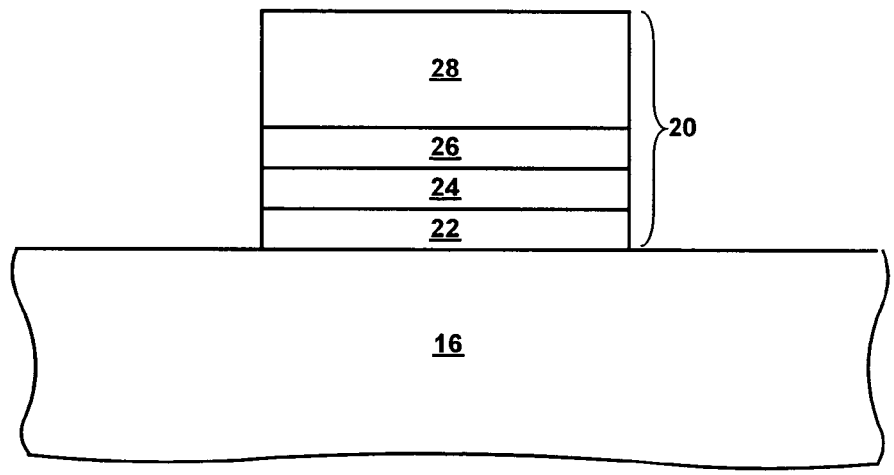
Figure 9:
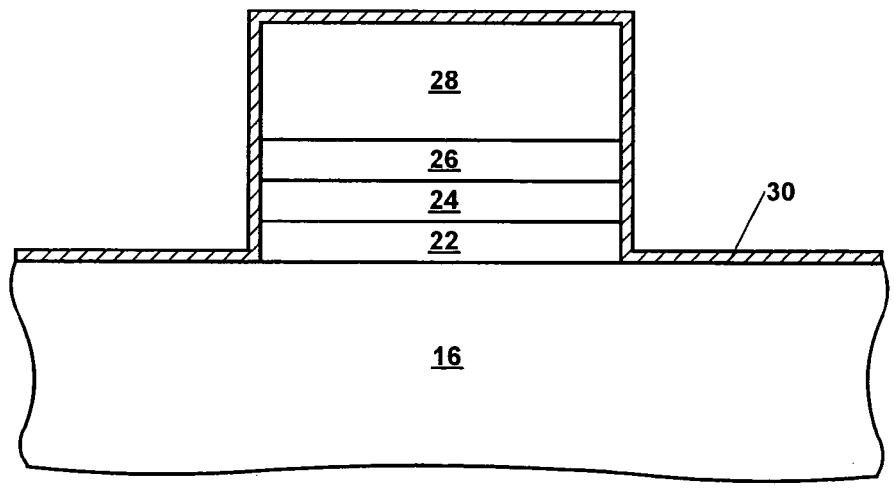
Figure 10:
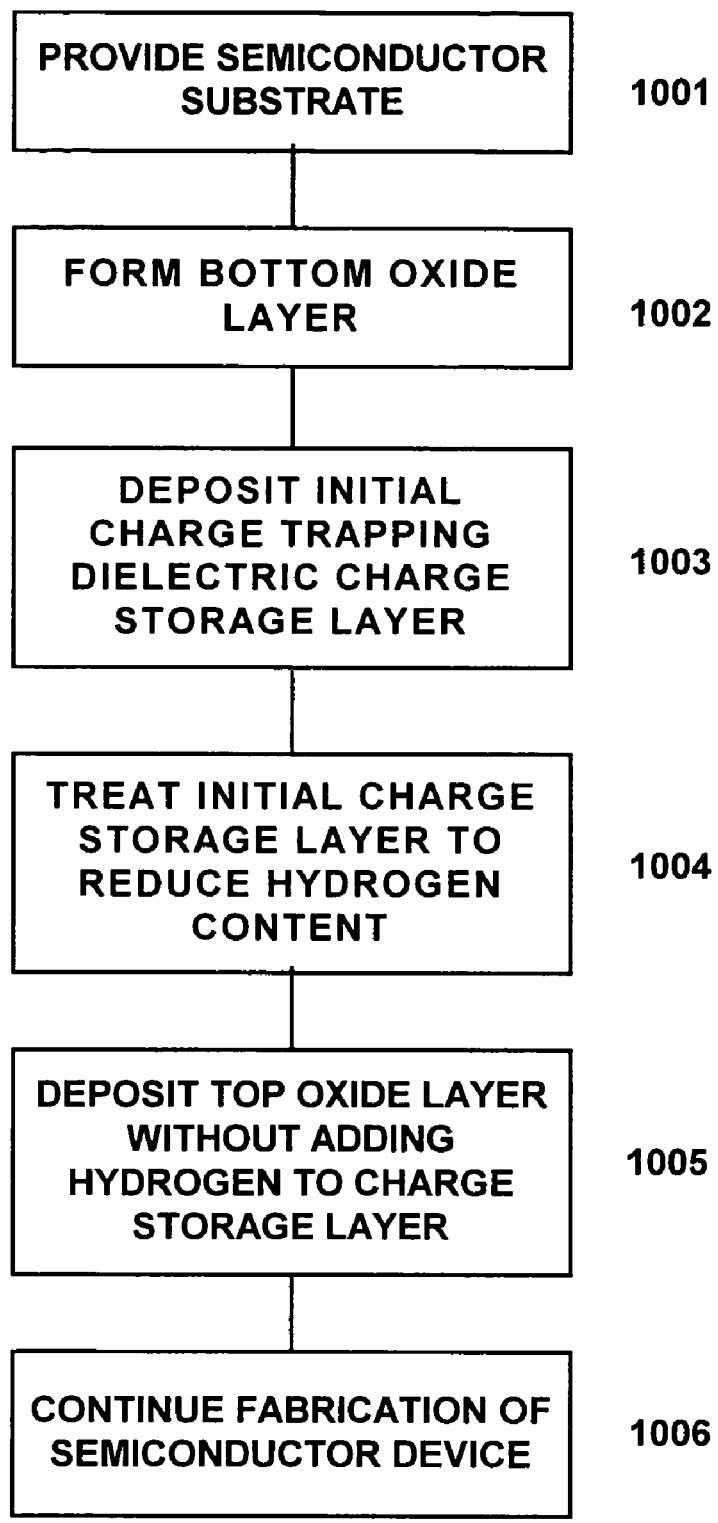
FIG. 10 is a schematic flow diagram generally illustrating steps of fabricating a device in accordance with another embodiment of the present invention.

A description of the present invention follows with reference to FIGS. 2–10. FIGS. 2–9 illustrate, in cross-section, process steps for the fabrication of a charge trapping dielectric charge storage layer, including formation and treatment of the charge storage layer in accordance with an embodiment of the invention. FIG. 10 is a schematic flow diagram generally illustrating steps of processes in accordance with embodiments of the present invention.

Figure 2:
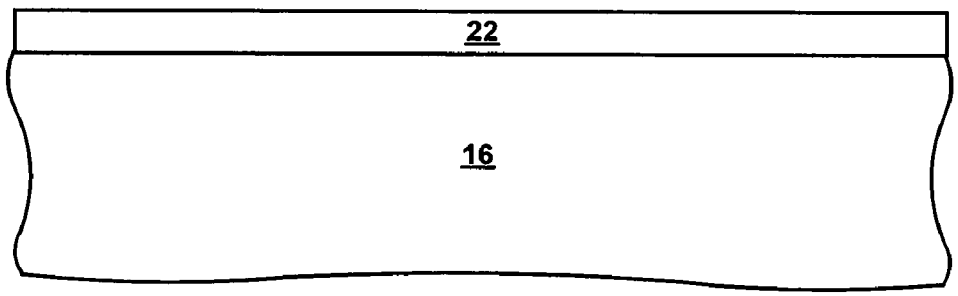
FIGS. 2–9 are schematic cross-sectional views of portions of a semiconductor substrate containing elements formed by steps in fabrication of a nitride layer such as a charge trapping dielectric charge storage layer and subsequent layers, in accordance with an embodiment of the present invention.

In the first step of the present invention, shown schematically in FIG. 10 as step 1001, a semiconductor substrate 16 is provided, such as is shown in FIG. 2 (in FIG. 2, the next step has already been carried out, i.e., formation of the bottom oxide layer 22). The semiconductor substrate can be any appropriately selected semiconductor substrate known in the art. For example, the semiconductor substrate can be a bulk silicon substrate, a silicon-on-insulator semiconductor substrate, a p-doped silicon substrate. Suitable semiconductor substrates include, for example, bulk silicon semiconductor substrates, silicon-on-insulator (SOI) semiconductor substrates, germanium-on-insulator (GOI), silicon-on-sapphire (SOS) semiconductor substrates, and semiconductor substrates formed of other materials known in the art. The present invention is not limited to any particular type of semiconductor substrate.

In the second step of the method in accordance with the present invention, shown in FIG. 10 as step 1002, and illustrated in FIG. 2, a bottom oxide layer 22 is formed on the semiconductor substrate 16.

In one embodiment, the bottom oxide layer 22 is silicon dioxide. However, the bottom oxide layer 22 is not limited to silicon dioxide. In one embodiment, the bottom oxide layer 22 comprises a high-K dielectric material, a composite dielectric material or, on one embodiment, a dielectric material substantially free of any high-K dielectric material. As used herein, the term "high-K dielectric material" refers to a dielectric material having a K of about 10 or higher. Such high-K dielectric materials include, for example, $HfO_2$, $ZrO_2$ and others, some of which are identified more fully below. In general, the term "high-K dielectric material" encompasses binary, ternary and higher oxides and any ferroelectric material having a K of about 10 or higher. In addition, the high-K dielectric materials include, for example, composite dielectric materials such as hafnium silicate, which has a K of about 14, and hafnium silicon oxynitride, which has a K of about 16, depending on the relative content of oxygen and nitrogen, and hafnium silicon nitride, which has a K of about 18.

Suitable high-K dielectric materials include $ZrO_2$, $HfO_2$, $Al_2O_3$, $Y_2O_3$, $La_2O_3$, silicates of one or more of $ZrO_2$, $HfO_2$, $Al_2O_3$, $Y_2O_3$, $La_2O_3$ or aluminates of one or more of $ZrO_2$, $HfO_2$, $Y_2O_3$, $La_2O_3$. Suitable high-K dielectric materials also include tantalum oxide ($Ta_2O_5$), barium titanate (BaTiO$_3$), titanium dioxide ($TiO_2$), cerium oxide ($CeO_2$), lanthanum oxide ($La_2O_3$), lanthanum aluminum oxide (LaAlO$_3$), lead titanate (PbTiO$_3$), strontium titanate (SrTiO$_3$), lead zirconate (PbZrO$_3$), tungsten oxide (WO$_3$), yttrium oxide ($Y_2O_3$), bismuth silicon oxide ($Bi_4Si_2O_{12}$), barium strontium titanate (BST) ($Ba_{1-x}Sr_xTiO_3$), PMN (Pb-Mg$_x$Nb$_{1-x}$O$_3$), PZT (PbZr$_x$Ti$_{1-x}$O$_3$), PZN (PbZn$_x$Nb$_{1-x}$O$_3$), and PST (PbSc$_x$Ta$_{1-x}$O$_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate can be used in the present invention. Other high-K dielectric materials known in the art, including, for example binary and ternary oxides having K values of about 10 or higher, also may be used in the present invention.

As used herein, the term "composite dielectric material" refers to a dielectric material comprising the elements of at least two other dielectric materials. A composite dielectric material generally has a K value of about 10 or higher, as defined above for a high-K dielectric material. A composite dielectric material may be, for example, a mixed-metal oxide, a metal silicate, a metal aluminate or a metal mixed-aluminate/silicate. Thus, for example, using hafnium as the exemplary metal, the composite dielectric material may be hafnium-zirconium oxide (Hf$_x$Zr$_{1-x}$O$_2$, where x ranges between 0 and 1), hafnium silicate (HfSiO$_4$), hafnium aluminate (HfAl$_2$O$_5$) or a hafnium mixed-aluminate/silicate, HfO$_2$/SiO$_2$/Al$_2$O$_3$, which may have a formula such as Hf$_2$Si$_2$Al$_2$O$_{11}$. A composite dielectric material may be formed by co-deposition of its component elements, or by sequential deposition followed by a treatment step, e.g., thermal treatment, to combine the elements to form the composite dielectric material. Suitable metals for the mixed-metal oxide, metal silicate, metal aluminate or metal mixed-aluminate/silicate include, for example, hafnium, zirconium, yttrium, cerium, tantalum, titanium, lanthanum, tungsten, bismuth, barium, strontium, scandium, niobium or lead, or mixtures thereof. Other metal oxides which, when combined with another metal oxide, silicon dioxide or aluminum oxide, or a mixture thereof, yield a material having a K value greater than that of silicon dioxide may be suitable. For example, the mixed-metal oxide, metal silicate, metal aluminate or metal mixed-aluminate/silicate is suitably one which substantially does not react with silicon (or polysilicon or polysilicon-germanium) at temperatures of about 600–800° C.

The bottom oxide layer 22 may be formed or deposited by any appropriate method known in the art. For example, the bottom oxide layer 22 can be formed by oxidation of the surface of the semiconductor substrate 16, e.g., by thermal oxidation, ISSG oxidation, steam oxidation or RTO. The bottom oxide layer 22 can also be formed by a deposition process, such as a CVD process. Exemplary CVD processes include, e.g., RTCVD, LPCVD, PECVD, ALD (ALCVD), PLD, MLD or MOCVD. The CVD method may be any appropriate CVD method known in the art. The bottom oxide layer 22 may be deposited by any other known suitable method, such as by a sputter deposition, or other vapor deposition. The present invention is not limited to any particular method for forming the bottom oxide layer 22.

The bottom oxide layer 22 is formed to have a thickness of from about 20 to about 500 angstroms. In one embodiment, the bottom oxide layer 22 has a thickness in a range from about 50 angstroms to about 200 angstroms, and in another embodiment, about 100 angstroms. As will be recognized, the thickness of the bottom oxide layer 22 may vary from these values.

Here and throughout the specification and claims, the limits of the disclosed ranges and ratios may be combined. Thus, for example, it is intended that the foregoing disclosed thickness ranges also include ranges from, e.g., about 20 angstroms to about 200 angstroms, and from about 50 angstroms to about 500 angstroms, although these ranges are not explicitly set forth.

Figure 3:
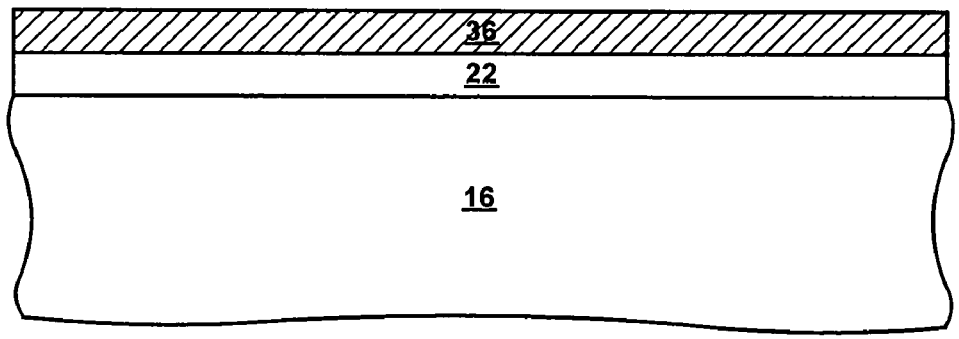

In the third step of the method in accordance with the present invention, shown schematically in FIG. 10 as step 1003, and in FIG. 3, a charge trapping dielectric material is deposited on the bottom oxide layer 22, to form an initial charge trapping dielectric charge storage layer 36 having a first, as-formed, hydrogen content. The initial charge storage layer 36 may contain at least about two atomic percent hydrogen, and may contain as much as 30 or more atomic percent hydrogen. In the following, the initial charge storage layer, as deposited, is referred to as the initial charge storage layer 36 and, after this layer has been treated to reduce the hydrogen content, it is referred to as the charge storage layer 24.

As noted above, the initial charge storage layer 36 (and, subsequently, the charge storage layer 24) may comprise silicon nitride or other known charge trapping dielectric materials, such as a suitable high-K dielectric material. Any of the high-K dielectric materials disclosed above with respect to the bottom oxide layer 22 may be used, as appropriate, for the initial charge storage layer 36. Thus, in one embodiment, the initial charge storage layer 36 comprises silicon nitride. In another embodiment, the initial charge storage layer 36 comprises a suitable high-K dielectric material. In another embodiment, the initial charge storage layer 36 comprises both a high-K dielectric material and a standard-K dielectric material, such as silicon nitride. In one embodiment, the initial charge storage layer 36 comprises a composite dielectric material, which comprises a composite or a reaction product of two or more dielectric materials, one of which is a high-K dielectric material and the other of which may be a standard-K dielectric material such as silicon nitride. The initial charge storage layer 36 may be deposited by any suitable method such as, for example, the CVD methods mentioned above, or by other suitable method, such as a sputter or other vapor deposition method. The present invention is not limited to any particular method of forming the initial charge storage layer 36.

In one embodiment, the initial charge storage layer 36 comprises silicon nitride and is deposited by a conventional method such as any of the methods described above with respect to formation of the bottom oxide layer 22. Thus, in one embodiment, the initial charge storage layer 36 is formed by a PECVD method, or the RTCVD or LPCVD methods described above. In one embodiment, the initial charge storage layer 36 is deposited by another suitable method, such as (pulsed layer deposition), MLD (molecular layer deposition) or MOCVD. The CVD method may be any appropriate CVD method known in the art. In one embodiment, the initial charge storage layer 36 comprises silicon nitride and is deposited by PECVD. As noted above, PECVD or LPCVD is conventionally used for deposition of such layers.

Following formation of the initial charge trapping dielectric charge storage layer 36, the following steps of the present invention are carried out in which the first hydrogen content, i.e., the hydrogen content of the initial layer 36 upon formation, is reduced to the second hydrogen content, i.e., the lower hydrogen content of the charge storage layer 24. In one embodiment, described in step 1004, the initial charge trapping dielectric charge storage layer 36 is treated to reduce its hydrogen content, as shown in step 1004 and depicted in FIG. 4, to form the final charge storage layer 24, depicted in FIG. 5. Thereafter, the top oxide layer 26 is deposited over the charge trapping dielectric charge storage layer 24, as shown in step 1005 and depicted in FIG. 6.

Figure 4:
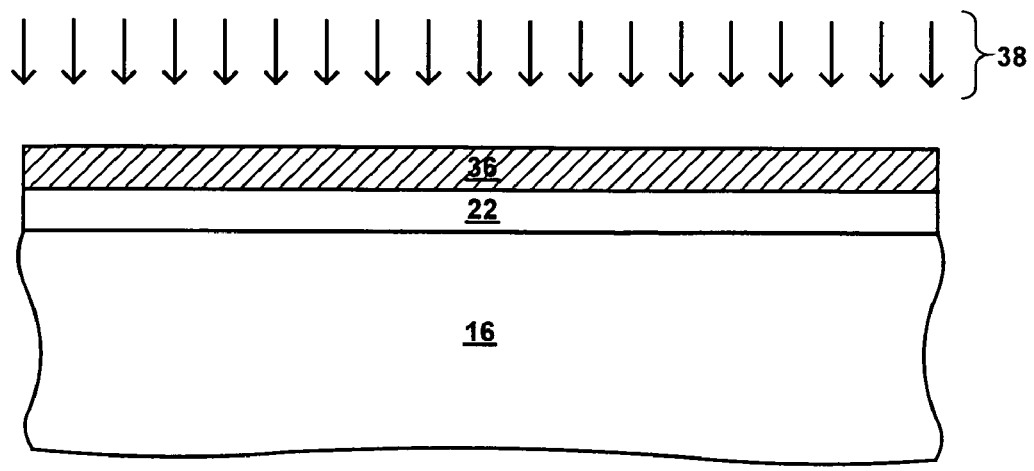
Figure 5:
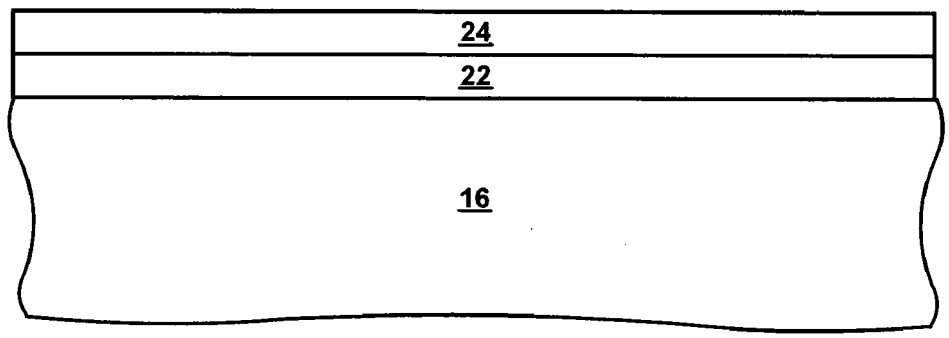

FIG. 4 schematically illustrates the step of applying a treatment to the initial charge storage layer 36 to reduce the first hydrogen content to a second, lower hydrogen content, by application of one or more of the procedures described in the following, in which the treatment is illustrated schematically by arrows 38. The arrows 38 illustrate, e.g., oxygen atoms or ions being added to the initial charge storage layer 36 by an appropriate method, such as one of the methods described in the following.

In one embodiment, the step of treating the initial charge storage layer 36 to reduce the hydrogen content in essence slightly oxidizes, or adds oxygen to, the material of the initial charge storage layer 36, to remove hydrogen by formation of water by the reaction of the applied oxygen with the hydrogen contained in the as-deposited material of the initial charge storage layer 36. Under most conditions of carrying out the step of applying a treatment to reduce the hydrogen content, e.g., a relatively high temperature, any water so formed is rapidly evaporated, thus effectively removing the hydrogen form the initial charge storage layer 36.

In one embodiment, the step of applying a treatment to the initial charge storage layer 36 to reduce its hydrogen content comprises annealing in an atmosphere comprising one or more of oxygen, ozone or nitrous oxide or other highly reactive oxygen-containing materials, at a temperature in the range from about 400° C. to about 1100° C. In one embodiment, the annealing is in an atmosphere comprising oxygen, and is carried out at a temperature in the range from about 600° C. to about 1100° C. In another embodiment, the annealing is in an atmosphere comprising ozone, and is carried out at a temperature in the range from about 400° C. to about 600° C. In another embodiment, the annealing is in an atmosphere comprising nitrous oxide, and is carried out at a temperature in the range from about 400° C. to about 600° C.

In one embodiment, the annealing is carried out in a high density plasma comprising one or more of oxygen, ozone or nitrous oxide. In one embodiment, the high density plasma annealing treatment is at a temperature in the range from about 300° C. to about 500° C. In one embodiment, the plasma power is between about 1000 to about 5000 watts. In one embodiment, the chamber pressure is between about 5 and about 100 torr. The plasma anneal may be carried out for a time between about 0.1 and about 5 minutes. The flow rate of oxygen, ozone and/or nitrous oxide may be appropriately selected.

The annealing in one or more of oxygen, ozone or nitrous oxide causes oxygen to enter the initial charge storage layer 36, and forces the reactive oxygen into the initial charge storage layer 36 and to react with hydrogen present therein, thus reducing the hydrogen content from the first to the second hydrogen content and forming the charge storage layer 24.

In one embodiment, the step of applying a treatment to the initial charge storage layer 36 to reduce its hydrogen content comprises (a) a decoupled plasma oxidation, followed optionally by (b) annealing in an atmosphere comprising oxygen and at least one inert gas, such as Ar or $N_2$. Other inert gases may be used, such as He, Ne or Kr. In one embodiment, (a) and (b) are sequentially repeated from two to about five times. In this embodiment, the steps both result in additional oxygen entering the initial charge storage layer 36. These steps cause the oxygen to react with any hydrogen present, after which water thus formed is forced to exit the initial charge storage layer 36.

The decoupled plasma in (a) differs from a conventional plasma in that in a decoupled plasma, the applied power is separated into a source power, which is a high power supplied to the chamber wall, and a bias power which is connected to the wafer. The source power ionizes the gas supplied into the chamber, and generates the reactive species in the chamber. The bias power on the wafer drives the reactive species towards the substrate and thus controls the rate of reaction. Hence, separation of these power sources provides better control of the process, as compared to conventional plasma which uses a single power source to create the plasma and to drive the generated species into the target.

Those skilled in the art will realize that power settings, residence times, gas flow rates are equipment-specific and will vary from one brand of plasma equipment to another. In general, the gas mixture employed includes oxygen in some reactive form, such as oxygen, ozone or nitrous oxide, and may also include argon. The oxygen flow ranges from about 5 standard cubic centimeters per minute (sccm) to about 500 sccm, and in one embodiment, about 250 sccm. In an embodiment including argon, the argon flow may range from about 20 sccm to about 300 sccm, and in one embodiment, about 50 sccm. In one embodiment, the gas pressure in the chamber ranges from about 5 millitorr (mT) to about 100 mT, and in one embodiment, about 20 mT. The decoupled plasma equipment parameters include a source power of about 400 W to about 2000 W, and in one embodiment, about 1400 W, and a bias power of about 50 W to about 500 W, and in one embodiment, about 200 W. The decoupled plasma may be applied to the spacer layer 36 for a period from about 1 seconds to about 100 seconds, and in one embodiment, for about 5 to about 10 seconds.

In one embodiment, following application of (a) the decoupled plasma, the initial charge storage layer 36 is (b) annealed in an atmosphere comprising oxygen and at least one inert gas, such as Ar or $N_2$, at a temperature in the range from about 600° C. to about 1100° C., and in one embodiment from about 700° C. to about 850° C., for a period ranging from about 1 second to about 2 minutes, and in one embodiment, for a period ranging from about 5 seconds to about 60 seconds. In one embodiment, the ratio of oxygen to the at least one inert gas ranges from about 1:20 to about 1:1, and in another embodiment, the ratio ranges from about 1:10 to about 1:2, and in another, the ratio ranges from about 1:7 to about 1:5. The annealing step (b) drives the oxygen into the initial charge storage layer 36, to provide better access to any hydrogen in the initial charge storage layer 36.

As indicated, the annealing step (b) is optional and may be omitted. For example, in one embodiment in which the initial charge storage layer 36 is being treated, the annealing step may be omitted, depending on the thickness of the initial charge storage layer 36. If the layer is relatively thin, the annealing may not be needed to effectively remove hydrogen.

In one embodiment, the step of applying a treatment to the initial charge storage layer 36 to reduce its hydrogen content comprises carrying out a rapid thermal oxidation (RTO) of the initial charge storage layer 36 at a temperature of about 700° C. to about 1150° C. in an oxidizing atmosphere. In one embodiment, the initial charge storage layer 36 may be treated by RTO at an elevated temperature in the presence of dry molecular oxygen. In one embodiment, the RTO is carried out at a temperature in the range of about 850° C. to about 1050° C., and in one embodiment, from about 900° C. to about 1000° C. The RTO process may be carried out in either a batch-type thermal oxidation furnace, or alternatively, in a single-wafer oxidation apparatus. In one embodiment, the RTO is carried out in the same RTP apparatus as that in which the other steps of the present process are carried out. In one embodiment, the RTP apparatus is part of a single-wafer cluster tool. In one embodiment, the oxygen content in the apparatus may range from about 1 to about 20 volume percent. In another embodiment, the oxygen content in the apparatus may range from about 1 to about 100 volume percent.

In one embodiment, the RTO is conducted in an atmosphere comprising oxygen and from about 2 to about 15 volume percent ozone at a temperature of at least about 750° C., up to about 1150° C., and in one embodiment between about 850° C. to about 1000° C. In one embodiment, the oxygen stream contains from about 3 to about 8 volume percent ozone, in another embodiment, from about 4 to about 7 volume percent ozone, and in another embodiment, from about 5 to about 6 volume percent ozone. The atmosphere in the RTO chamber may also contain small amounts of one or more other materials known in the art to enhance the rate of silicon oxidation. Such materials include, for example, chlorine (e.g., HCl, $Cl_2$, etc.), water, etc. If employed, such materials are generally employed in their conventional amounts (e.g., when HCl is employed, it is generally employed up to about 2.5 volume percent HCl).

In one embodiment, in the RTO, the initial charge storage layer 36 is held in the chamber at the selected temperature for a period ranging from about 1 second to about 100 seconds. As will be understood, the time varies depending on the temperature, the gases used, the nature and thickness of the initial charge storage layer 36, and other factors known to those of skill in the art. For example, higher temperatures and higher contents of ozone and/or other oxidation enhancing agents generally require shorter times.

In one embodiment, the step of applying a treatment to the initial charge storage layer 36 to reduce its hydrogen content comprises applying free radical oxidation conditions to the initial charge storage layer 36. Suitable free radical oxidation conditions may include any such conditions known in the art, for example, by exposing the initial charge storage layer 36 to an oxygen plasma, in which oxygen free radicals are generated. The oxygen free radicals can penetrate into the initial charge storage layer 36 to react with any hydrogen encountered. As a result of the reaction, water may be formed, and thence evaporated from the initial charge storage layer 36, thereby effectively removing hydrogen and reducing the hydrogen content of the initial charge storage layer 36 from the first to the second, lower hydrogen content, forming the charge storage layer 24.

In one embodiment, the step of applying a treatment to the initial charge storage layer 36 to reduce its hydrogen content comprises exposing the initial charge storage layer 36 to in-situ steam generation (ISSG) oxidation. In one embodiment, the treatment by ISSG oxidation is carried out by placing the initial charge storage layer 36 in an RTP chamber and flowing a mixture of oxygen-containing gas and hydrogen-containing gas to the chamber at suitable flow rates and pressure. The temperature of the RTP chamber can be in the range from about 700° C. to about 1150° C. The flow rates and temperature may be suitably selected to provide rapid oxidation of hydrogen in the initial charge storage layer 36. In one embodiment, in order to avoid excess oxidation of the initial charge storage layer 36, the quantity of steam generated in the reaction chamber is reduced by introduction of an inert gas, such as argon. In any case, the ISSG conditions and times should be adjusted to avoid undue oxidation of the material of the initial charge storage layer 36.

For the ISSG process described above, any of the commercially available RTP systems can be utilized.

In one embodiment, the hydrogen-containing gas is hydrogen gas, $H_2$. In another embodiment, the hydrogen-containing gas is methane, $CH_4$. In one embodiment, methane is disfavored due to the possible incorporation of carbon into the initial charge storage layer 36.

In one embodiment, the oxygen-containing gas is oxygen gas, $O_2$. In another embodiment, the oxygen-containing gas is nitrous oxide, $N_2O$.

When the hydrogen-containing gas is hydrogen and the oxygen containing gas is oxygen, in one embodiment, the ratio of hydrogen to oxygen is about 2:1, i.e., a substantially stoichiometric ratio. In one embodiment, an increased amount of oxygen is provided, in order to more rapidly drive the ISSG oxidation to completion. Thus, in one embodiment, the ratio of oxygen to hydrogen is in the range from greater than about 2:1 to about 5:1. In another embodiment, the ratio of oxygen to hydrogen is in the range from greater than about 2:1 to about 3:1. In one embodiment, the ratio of oxygen to hydrogen is maintained at a super-stoichiometric ratio, in order to avoid or minimize the presence of free hydrogen, which could reverse the desired reaction which is intended to remove hydrogen from the initial charge storage layer 36.

In one embodiment, the absolute pressure in the RTP chamber is in the range from about 50 Torr to about 500 Torr. In another embodiment, the absolute pressure in the RTP chamber is in the range from about 100 Torr to about 300 Torr, and in another embodiment, from about 100 Torr to about 200 Torr, and in another, at about 150 Torr.

In one embodiment, the ISSG reaction is carried out so that the hydrogen-oxygen reaction takes place substantially at the surface of the initial charge storage layer 36, by heating only the surface of the wafer. In one embodiment, a portion of the oxygen provided may react with hydrogen from the initial charge storage layer 36. Formation of the in-situ generated steam at the surface of the initial charge storage layer 36 allows greater control over the ISSG oxidation than is available with either other forms of steam oxidation or other oxidations, such as dry oxygen oxidation, or fluorine-enhanced oxidation.

The ISSG oxidation of the initial charge storage layer 36 may continue for a period in the range from about 1 second to about 100 seconds. In one embodiment, the ISSG oxidation of the spacer layer 36 continues for a period from about 2 to about 10 seconds.

In one embodiment, the step of applying a treatment to reduce the hydrogen content of the initial charge storage layer 36 comprises applying steam oxidation conditions to the layer. The steam oxidation is carried out for a brief period by methods known in the art. Thus, for example, the initial charge storage layer 36 is exposed to a steam-containing (or water vapor-containing) atmosphere at a temperature ranging from about 400° C. to about 1100° C., for a period ranging from about 0.1 minute to about 5 minutes. In another embodiment, the steam oxidation maybe carried out at a temperature in the range from about 400° C. to about 900° C., and in another embodiment, the steam oxidation maybe carried out at a temperature in the range from about 800° C. to about 1100° C., each for an appropriate time. The exposure time should be short enough that a substantial portion of the initial charge storage layer 36 is not degraded by the steam, but long enough to cause reaction with and removal of at least a portion of the hydrogen in the initial charge storage layer 36.

In the foregoing methods of carrying out the step 1004, in which a treatment is applied to reduce the hydrogen content of the initial charge storage layer 36 to form the charge storage layer 24, the conditions and times should be adjusted to avoid excessive oxidation of the charge trapping dielectric material, while at the same time being sufficient to reduce the hydrogen content thereof from the first hydrogen content to the second, lower hydrogen content. As will be understood by a person of ordinary skill in the art, some experimentation may be needed to adjust the conditions and times needed to obtain the desired hydrogen content reduction, depending on the nature of the charge trapping dielectric material and the method selected for use in reducing the hydrogen content thereof.

As a result of the foregoing step 1004, in which one of the foregoing treatments has been applied to the initial charge storage layer 36, the hydrogen content of the initial charge storage layer 36 is reduced from the first, as-formed hydrogen content, to form as a result the charge storage layer 24 which has the second, lower hydrogen content.

The second, lower hydrogen content of the charge trapping dielectric charge storage layer 24 after such treatment, as used herein, means that the hydrogen content of the charge trapping dielectric material is less than the hydrogen content of a conventional charge trapping dielectric charge storage layer material, i.e., as the charge trapping dielectric material was originally deposited by the conventional methods described above. In one embodiment, the charge trapping dielectric charge storage layer 24 according to the present invention comprises a hydrogen content of about 2 atomic percent or less, while the hydrogen content of the initial charge trapping dielectric charge storage layer 36 is substantially greater than 2 atomic percent. In some embodiments, in the initial charge trapping dielectric charge storage layer 36, the hydrogen content may range from about 3 atomic percent hydrogen to about 30 atomic percent, and in other embodiments, from about 5 atomic percent hydrogen to about 20 atomic percent, and in other embodiments from about 5 atomic percent to about 10 atomic percent hydrogen.

In accordance with the present invention, the charge trapping dielectric charge storage layer 24, formed as a result of the treatment to reduce the hydrogen content, comprises hydrogen at about 2 atomic percent or less, and in one embodiment, comprises hydrogen at about 1 atomic percent or less, or in another embodiment, comprises hydrogen at about 0.5 atomic percent or less. In one embodiment, the charge trapping dielectric charge storage layer 24 comprises a hydrogen content less than about 0.1 atomic percent. In one embodiment, the charge trapping dielectric charge storage layer 24 comprises a hydrogen content in the range from about 0.1 atomic percent to about 0.5 atomic percent. In one embodiment, in the charge trapping dielectric charge storage layer 24, hydrogen is substantially not detectable, when it is measured by, for example, FTIR.

Hydrogen content may be determined by, for example, FTIR (Fourier Transform IR), SIMS (Secondary Ion Mass Spectroscopy) or RBS (Rutherford Backscattering Spectroscopy). At present the lower limit of detection of hydrogen by FTIR is about 0.05 atomic percent. In one embodiment, the hydrogen content of the both the initial charge trapping dielectric charge storage layer 36 and the charge trapping dielectric charge storage layer 24 after treatment can be determined by use of FTIR (Fourier transform infrared spectroscopy). With currently available FTIR, levels of hydrogen lower than about 0.05 atomic percent are difficult to measure. Thus, when the hydrogen content of the layer 24 is low enough that it cannot be detected by FTIR, it may be considered to be substantially zero hydrogen content.

In one embodiment, hydrogen substantially does not migrate from the charge trapping dielectric charge storage layer 24 having the second, reduced hydrogen content into the adjacent oxide layers, i.e., the bottom oxide layer 22 or the top oxide layer 26, during subsequent processing or in use. Thus, in this embodiment, whatever the absolute hydrogen content, the hydrogen content of the charge trapping dielectric charge storage layer 24 is reduced to a level such that substantially no hydrogen migrates from the layer 24 during subsequent processing in the fabrication of the device, or during subsequent use of the device by an end user. "Substantially no hydrogen migrates" means that no, or very little, if any, hydrogen migrates, and any hydrogen that does migrate is either not detectable or has no adverse effect on operation of the flash memory device.

Figure 6:
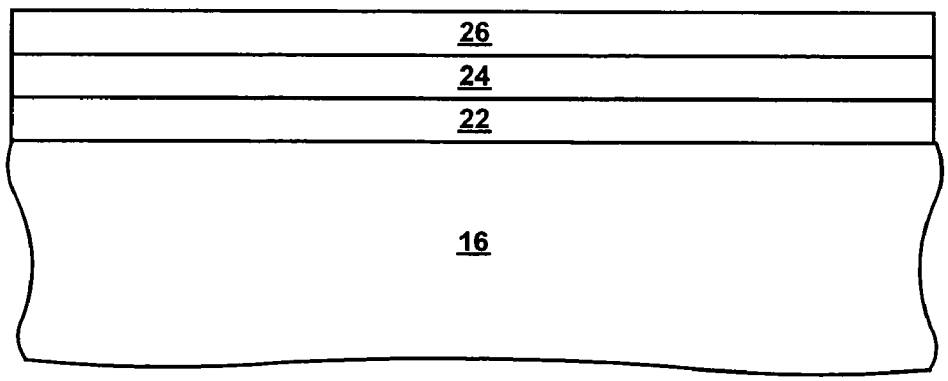

Upon completion of step 1004, in the next step in accordance with one embodiment of the present invention, shown schematically in FIG. 10 as step 1005, a top oxide layer 26 is formed overlying the charge storage layer 24, to form a structure such as that shown in FIG. 6. The top oxide layer 26 may comprise, independently, any of the materials disclosed above for the bottom oxide layer 22. For example, the top oxide layer 26 may comprise silicon dioxide, a high-K dielectric material or a composite dielectric material, as defined herein.

The top oxide layer 26 may be deposited by any of the methods disclosed above for the bottom oxide layer 22. Thus, in one embodiment, the top oxide layer 26 is formed by an HTO deposition, such as the RTCVD or LPCVD methods described above. In one embodiment, the top oxide layer 26 is deposited by another suitable method, such as PECVD, ALD (ALCVD), PLD, MLD or MOCVD. The CVD method may be any appropriate CVD method known in the art.

In one embodiment, the top oxide layer is formed by a method which does not introduce hydrogen into the charge trapping dielectric charge storage layer 24. Since the layer 24 has been treated, in accordance with the present invention, to reduce the hydrogen content from the first, as-formed, hydrogen content to the second, lower hydrogen content, care should be taken thereafter that hydrogen is not re-introduced into the charge storage layer 24. In this embodiment, the top oxide layer 26 is formed or deposited by using methods which do not impart hydrogen to the charge storage layer 24.

In one embodiment, the top oxide layer is formed by one of oxidation of a portion of the charge storage layer or deposition using low-hydrogen starting materials. In one embodiment, the top oxide layer 26 is formed by oxidation of a portion of the charge storage layer 24. Such methods include, for example, ISSG and RTO at a temperature in the range from about 900° C. to about 1100° C. In one embodiment, the top oxide layer 26 is formed by ISSG oxidation of a part of the upper surface of the charge storage layer 24, when the charge storage layer material comprises silicon in an oxidizable form, such as silicon nitride. Methods of ISSG oxidation are known in the art.

In one embodiment of the ISSG treatment, the step of treating the initial charge storage layer 36 to form the charge storage layer 24 is combined with, or is carried out sequentially with, the step of forming the top oxide layer 26. In one embodiment, the conditions are substantially the same and are carried out for a sufficient time to both remove hydrogen from the initial charge storage layer 36 (thus forming the charge storage layer 24) and to deposit the top oxide layer 26 thereover. In another embodiment, the ISSG conditions are changed, from an initial, less-intense combination of conditions, to a later, more-intense combination of conditions. In this embodiment, the initial, less-intense conditions may include, for example, one or more of lower temperature, higher content of inert gas and/or a shorter time, which initial conditions are used to reduce the hydrogen content. In this embodiment, the later, more-intense conditions may include, for example, one or more of higher temperature, lower content of inert gas, longer times, and/or adjustments in the oxygen content. In one embodiment, the conditions are changed in the course of carrying out the ISSG oxidation, without removing the substrate from a reaction chamber.

In one embodiment, the top oxide layer 26 is deposited by a method using low-hydrogen starting materials. In one embodiment, the top oxide layer 26 comprises silicon, and the low-hydrogen starting materials comprise one or more of tetrachlorosilane (TCS), dichlorosilane (DCS), or bis-t-butylamino silane (BTBAS). TCS contains no hydrogen, and DCS and BTBAS each contain only 2 atoms of hydrogen bound to the silicon atom.

Once the top oxide layer 26 has been deposited, the combined structure including the bottom oxide 22, the charge trapping dielectric charge storage layer 24 and the top oxide layer 26 constitutes an ONO structure. As noted above, the materials of each of the layers of the ONO structure may comprise material other than oxide, nitride, oxide.

Figure 7:
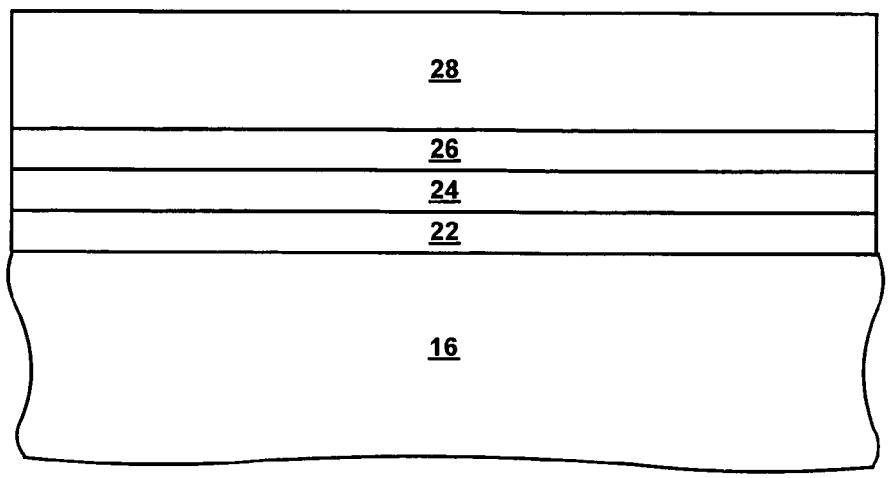

When the top oxide layer 26 has been deposited, forming a structure such as that shown in FIG. 6, fabrication of the semiconductor device continues, as known in the art. For example, the following steps may include, for example, deposition of a control gate electrode layer 28, as shown in FIG. 7, a step of etching the layers to form the gate stack 20 shown in FIG. 8, a step of depositing a thin oxide layer 30 as shown in FIG. 9, and a step of forming gate stack spacers 32, as shown in FIG. 1.

At this point, step 1005 shown in FIG. 10 has been completed, and other steps known in the art may be subsequently carried out as appropriate to continue fabrication of the semiconductor device.

In one embodiment, above the layers comprising the ONO structure, a control gate electrode layer 28 may be formed on the top oxide layer 26. The structure shown in FIG. 7 is completed by formation or deposition of the control gate electrode layer 28 overlying the top oxide layer 26. The control gate electrode layer 28 may comprise any material known in the art for such use. For example, the control gate electrode layer 28 may comprise polysilicon, polysilicon-germanium, a metal silicide, a metal, or any other suitable material known in the art.

As used herein, the term "polysilicon-germanium" refers to a mixture of polysilicon and germanium, in which the germanium content varies from slightly more than zero up to about 60% by weight by the mixture. Thus, the amount of germanium may range from a doping amount up to about 60% by weight, of the mixture. The polysilicon-germanium may be formed by any method known in the art, i.e., by doping polysilicon with germanium, or by co-deposition, for example.

In one embodiment, following formation of the layers 22, 24, 26 and 28 of which the gate stack 20 is comprised, as shown in FIG. 7, a lithographic patterning and etching process may then be carried out to define the gate stack 20 structure shown in FIG. 8.

In the etching step, any known, conventional etching processes may be used, with the proviso that the methods be carried out in a manner which does not result in addition of hydrogen to the remaining charge trapping dielectric charge storage layer 24. In one exemplary embodiment, reactive ion etching is used for the etching step. In another exemplary embodiment, a dry plasma etch technique is used for the etching step.

In one embodiment, a thin oxide layer 30, such as that shown in FIG. 9, may be formed or deposited over the gate stack 20 and over the surface of other portions of the semiconductor substrate 16 not covered by the gate stack 20.

At this point, a semiconductor substrate 16 having formed thereon a gate stack 20 comprising the charge trapping dielectric charge storage layer 24 having the second, reduced hydrogen content, and a control gate electrode 28 overlying the charge trapping dielectric charge storage layer 24 has been provided, and covered by the thin oxide layer 30, such as shown in FIG. 9, in accordance with the present invention. At this point, fabrication of the flash memory device or other semiconductor device may proceed as known in the art.

There has been disclosed in accordance with the invention a process for fabricating a charge trapping dielectric charge storage flash memory device, for example for use in a MIRRORBIT™ device, that fully provides the advantages set forth above. Although described in terms of, and particularly applicable to, charge trapping dielectric charge storage flash memory devices, the present invention is broadly applicable to fabrication of any semiconductor device including a structure in which hydrogen content needs to be reduced to avoid migration of hydrogen to other parts of the device which may be sensitive to the presence of hydrogen.

INDUSTRIAL APPLICABILITY

The present invention provides a solution to various problems resulting from the presence of hydrogen in materials such as silicon nitride of which a charge trapping dielectric charge storage layer is formed. Thus, the present invention helps to eliminate or reduce problems resulting from hydrogen in the charge trapping dielectric charge storage layer structure used in charge trapping dielectric flash memory devices, or in the nitride layer of an ONO structure in a semiconductor device containing such a structure.

Although the invention has been described and illustrated with reference to specific illustrative embodiments thereof, it is not intended that the invention be limited to those illustrative embodiments. Those skilled in the art will rec ognize that variations and modifications can be made without departing from the spirit of the invention. For example, the thicknesses of the individual layers making up the gate stack structure, the thin oxide layer and the charge trapping dielectric charge storage layers can be varied from that described herein. Furthermore, as noted, the invention is broadly applicable to any semiconductor device including a nitride layer of an ONO structure which may contain hydrogen in amounts which can interfere with operation of the device if not removed. It is therefore intended to include within the invention all such variations and modifications that fall within the scope of the appended claims and equivalents thereof.

What is claimed is:

1. A process for fabricating a semiconductor device having a ONO structure, comprising:
   providing a semiconductor substrate;
   forming on the semiconductor substrate an oxide layer;
   depositing on the bottom oxide layer a nitride layer, the deposited nitride layer having a first hydrogen content; and
   applying a treatment to reduce the first hydrogen content to a second hydrogen content, wherein the second hydrogen content is less than about two atomic percent.

2. The process of claim 1, wherein the treatment comprises one or more of RTO oxidation of at least a portion of the charge trapping dielectric charge storage layer in an oxidizing atmosphere, ISSG oxidation of at least a portion of the charge trapping dielectric charge storage layer, free radical oxidation of at least a portion of the charge trapping dielectric charge storage layer, decoupled plasma oxidation of at least a portion of the charge trapping dielectric charge storage layer, and steam oxidation of at least a portion of the charge trapping dielectric charge storage layer at a temperature in the range from about 400° C. to about 1100° C.

3. The process of claim 1, wherein the first hydrogen content is in a range from greater than about 2 atomic percent to about 30 atomic percent.

4. The process of claim 1, wherein the second hydrogen content is less than about 0.1 atomic percent.

5. The process of claim 1, wherein the second hydrogen content is in the range from about 0.1 atomic percent to about 0.5 atomic percent.

6. The process of claim 1, wherein the second hydrogen content is substantially zero or not detectable by FTIR.

7. The process of claim 1, wherein hydrogen substantially does not migrate into the bottom oxide layer from the nitride layer during subsequent processing or in use.

8. The process of claim 1, further comprising forming on the nitride layer a top oxide layer by a method which does not impart hydrogen to the nitride layer.

9. The process of claim 8, wherein the top oxide layer is formed by one of oxidation of a portion of the nitride layer or deposition using low-hydrogen starting materials.

10. A process for fabricating a charge trapping dielectric flash memory device comprising:
    providing a semiconductor substrate;
    forming on the semiconductor substrate a bottom oxide layer;
    depositing on the bottom oxide layer a charge trapping dielectric charge storage layer, the deposited charge trapping dielectric charge storage layer having a first hydrogen content; and
    applying a treatment to reduce the first hydrogen content to a second hydrogen content, wherein the second hydrogen content is less than about two atomic percent.

11. The process of claim 10, wherein the treatment comprises one or more of RTO oxidation of at least a portion of the charge trapping dielectric charge storage layer in an oxidizing atmosphere, ISSG oxidation of at least a portion of the charge trapping dielectric charge storage layer, free radical oxidation of at least a portion of the charge trapping dielectric charge storage layer, decoupled plasma oxidation of at least a portion of the charge trapping dielectric charge storage layer, and steam oxidation of at least a portion of the charge trapping dielectric charge storage layer at a temperature in the range from about 400° C. to about 1100° C.

12. The process of claim 10, wherein the first hydrogen content is in a range from greater than about 2 atomic percent to about 30 atomic percent.

13. The process of claim 10, wherein the second hydrogen content is less than about 0.1 atomic percent.

14. The process of claim 10, wherein the second hydrogen content is in the range from about 0.1 atomic percent to about 0.5 atomic percent.

15. The process of claim 10, wherein the second hydrogen content is substantially zero or not detectable by FTIR.

16. The process of claim 10, wherein hydrogen substantially does not migrate into the bottom oxide layer from the charge storage layer during subsequent processing or in use.

17. The process of claim 10, further comprising forming on the charge storage layer a top oxide layer by a method which does not impart hydrogen to the charge storage layer.

18. The process of claim 17, wherein the top oxide layer is formed by one of oxidation of a portion of the nitride layer or deposition using low-hydrogen starting materials, wherein the low-hydrogen starting materials comprise one or more of TCS, DCS, BTBAS.

19. A charge trapping dielectric flash memory device comprising:
    a semiconductor substrate having formed thereon a gate stack comprising a charge trapping dielectric charge storage layer; and
    wherein the charge trapping dielectric charge storage layer comprises a hydrogen content less than about two atomic percent.

20. The device of claim 19, wherein the hydrogen content is in the range from about 0.1 atomic percent to about 0.5 atomic percent.

* * * * *